United States Patent
Ogawa et al.

(10) Patent No.: US 9,018,099 B2
(45) Date of Patent: Apr. 28, 2015

(54) POLISHING PAD

(75) Inventors: Kazuyuki Ogawa, Osaka (JP); Atsushi Kazuno, Osaka (JP); Tsuyoshi Kimura, Osaka (JP); Tetsuo Shimomura, Osaka (JP)

(73) Assignee: Toyo Tire & Rubber Co., Ltd., Osaka-shi (JP)

( * ) Notice: Subject to any disclaimer, the term of this patent is extended or adjusted under 35 U.S.C. 154(b) by 779 days.

(21) Appl. No.: 12/531,005

(22) PCT Filed: Mar. 12, 2008

(86) PCT No.: PCT/JP2008/054444
§ 371 (c)(1),
(2), (4) Date: Sep. 11, 2009

(87) PCT Pub. No.: WO2008/126578
PCT Pub. Date: Oct. 23, 2008

(65) Prior Publication Data
US 2011/0053377 A1    Mar. 3, 2011

(30) Foreign Application Priority Data
Mar. 15, 2007  (JP) .................. 2007-066966

(51) Int. Cl.
*H01L 21/306* (2006.01)
*B44C 1/22* (2006.01)
*B24B 37/20* (2012.01)

(52) U.S. Cl.
CPC ........ *H01L 21/30625* (2013.01); *B24B 37/205* (2013.01)

(58) Field of Classification Search
CPC .................. B24B 37/205; H01L 21/30625
USPC .................. 438/692; 451/6, 8, 41; 51/296
See application file for complete search history.

(56) References Cited

U.S. PATENT DOCUMENTS

| 5,605,760 A | 2/1997 | Roberts |
| 5,893,796 A | 4/1999 | Birang et al. |
| 5,964,643 A | 10/1999 | Birang et al. |

(Continued)

FOREIGN PATENT DOCUMENTS

| JP | 9-7985 | 1/1997 |
| JP | 10-83977 | 3/1998 |

(Continued)

OTHER PUBLICATIONS

Taiwanese Office Action received Jul. 5, 2011, directed towards Taiwan Patent Application No. 097108835; 6 pages.

(Continued)

*Primary Examiner* — Shamim Ahmed
(74) *Attorney, Agent, or Firm* — Morrison & Foerster LLP

(57) ABSTRACT

An object of the present invention is to provide a polishing pad that is prevented from causing an end-point detection error due to a reduction in light transmittance from the early stage to the final stage of the process, and to provide a method of producing a semiconductor device with the polishing pad. The present invention is directed to a polishing pad, comprising a polishing layer comprising a polishing region and a light-transmitting region, wherein a polishing side surface of the light-transmitting region is subjected to a surface roughness treatment, and the light-transmitting region has a light transmittance of 40% to 60% at a wavelength of 600 nm before use.

3 Claims, 2 Drawing Sheets

(56) References Cited

U.S. PATENT DOCUMENTS

| | | | |
|---|---|---|---|
| 6,045,439 | A | 4/2000 | Birang et al. |
| 6,280,290 | B1 | 8/2001 | Birang et al. |
| 6,537,133 | B1 | 3/2003 | Birang et al. |
| 6,676,483 | B1 * | 1/2004 | Roberts .............................. 451/6 |
| 6,676,717 | B1 | 1/2004 | Birang et al. |
| 6,719,818 | B1 | 4/2004 | Birang et al. |
| 6,876,454 | B1 | 4/2005 | Birang et al. |
| 6,994,607 | B2 * | 2/2006 | Wiswesser ........................ 451/5 |
| 7,169,017 | B1 | 1/2007 | Saikin |
| 7,183,213 | B2 * | 2/2007 | Shiho et al. .................. 438/692 |
| 2001/0036805 | A1 | 11/2001 | Birang et al. |
| 2002/0042243 | A1 * | 4/2002 | Ihsikawa et al. ................... 451/6 |
| 2002/0173231 | A1 | 11/2002 | Hasegawa |
| 2003/0190867 | A1 | 10/2003 | Birang et al. |
| 2004/0014395 | A1 | 1/2004 | Birang et al. |
| 2004/0106357 | A1 | 6/2004 | Birang et al. |
| 2005/0142996 | A1 | 6/2005 | Ohno et al. |
| 2005/0170751 | A1 | 8/2005 | Birang et al. |
| 2005/0245171 | A1 * | 11/2005 | Hosaka et al. .................... 451/6 |
| 2006/0014476 | A1 | 1/2006 | Birang et al. |
| 2006/0037699 | A1 * | 2/2006 | Nakamori et al. ....... 156/345.12 |
| 2006/0128271 | A1 * | 6/2006 | Shiho et al. ........................ 451/6 |
| 2007/0015441 | A1 | 1/2007 | Birang et al. |
| 2007/0021037 | A1 | 1/2007 | Birang et al. |
| 2007/0037488 | A1 * | 2/2007 | Saikin ................................ 451/6 |
| 2007/0042680 | A1 * | 2/2007 | Benvegnu et al. ................. 451/6 |
| 2007/0049167 | A1 * | 3/2007 | Swedek et al. .................... 451/6 |
| 2008/0227367 | A1 | 9/2008 | Birang et al. |

FOREIGN PATENT DOCUMENTS

| | | |
|---|---|---|
| JP | 11-512977 | 11/1999 |
| JP | 2002-324769 A | 11/2002 |
| JP | 2002-324770 A | 11/2002 |
| JP | 2003-285257 A | 10/2003 |
| JP | 2004-319584 A | 11/2004 |
| JP | 2007-49163 A | 2/2007 |

OTHER PUBLICATIONS

International Search Report mailed Jun. 24, 2008, directed to counterpart International Patent Application No. PCT/JP2008/054444; 2 pages.

Japanese Notification of Reasons for Refusal mailed Nov. 30, 2011, directed to counterpart Japanese Application No. 2007-066966; 4 pages.

First Office Action issued Mar. 6, 2012, directed to Taiwanese Application No. 097108835; 4 pages.

Office Action dated Jul. 4, 2012, directed to Chinese Application No. 200880008531.8; 11 pages.

Notification of the Third Office Action dated Mar. 14, 2014, directed to CN Application No. 200880008531.8; 13 pages.

Office Action dated Nov. 20, 2014, directed to KR Application No. 10-2009-7012466; 5 pages.

\* cited by examiner

POLISHING PAD

TECHNICAL FIELD

The present invention relates to a polishing pad used in planarizing an uneven surface of a wafer by chemical mechanical polishing (CMP) and in particular to a polishing pad having a window for sensing a polished state etc. by an optical means, as well as a method of producing a semiconductor device by the polishing pad.

BACKGROUND ART

Production of a semiconductor device involves a step of forming an electroconductive film on the surface of a wafer to form a wiring layer by photolithography, etching etc., a step of forming an interlaminar insulating film on the wiring layer, etc., and an uneven surface made of an electroconductive material such as metal and an insulating material is generated on the surface of a wafer by these steps. In recent years, processing for fine wiring and multilayer wiring is advancing for the purpose of higher integration of semiconductor integrated circuits, and accordingly techniques of planarizing an uneven surface of a wafer have become important.

As the method of planarizing an uneven surface of a wafer, a CMP method is generally used. CMP is a technique wherein while the surface of a wafer to be polished is pressed against a polishing surface of a polishing pad, the surface of the wafer is polished with an abrasive in the form of slurry having abrasive grains dispersed therein (hereinafter, referred to as slurry).

As shown in FIG. 1, a polishing apparatus used generally in CMP is provided for example with a polishing platen 2 for supporting a polishing pad 1, a supporting stand (polishing head) 5 for supporting a polished material (wafer) 4, a backing material for uniformly pressurizing a wafer, and a mechanism of feeding an abrasive. The polishing pad 1 is fitted with the polishing platen 2 for example via a double-coated tape. The polishing platen 2 and the supporting stand 5 are provided with rotating shafts 6 and 7 respectively and are arranged such that the polishing pad 1 and the polished material 4, both of which are supported by them, are opposed to each other. The supporting stand 5 is provided with a pressurizing mechanism for pushing the polished material 4 against the polishing pad 1.

When such CMP is conducted, there is a problem of judging the planarity of wafer surface. That is, the point in time when desired surface properties or planar state are reached should be detected. With respect to the thickness of an oxide film, polishing speed etc., the polishing treatment of a test wafer has been conducted by periodically treating the wafer, and after the results are confirmed, a wafer serving as a product is subjected to polishing treatment.

In this method, however, the treatment time of a test wafer and the cost for the treatment are wasteful, and a test wafer and a product wafer not subjected to processing are different in polishing results due to a loading effect unique to CMP, and accurate prediction of processing results is difficult without actual processing of the product wafer.

Accordingly, there is need in recent years for a method capable of in situ detection of the point in time when desired surface properties and thickness are attained at the time of CMP processing, in order to solve the problem described above. For such detection, various methods have been used, and from the viewpoint of measurement accuracy and spatial resolution in non-contact measurement, an optical detection means is becoming the mainstream.

The optical detection means is specifically a method of detecting the end-point of polishing by irradiating a wafer via a polishing pad through a window (light-transmitting region) with a light beam, and monitoring an interference signal generated by reflection of the light beam.

In such method, the end-point is determined by knowing an approximate depth of surface unevenness through monitoring of a change in the thickness of a surface layer of a wafer. When such change in thickness becomes equal to the thickness of the unevenness, the CMP process is finished. As a method of detecting the end-point of polishing by such optical means and a polishing pad used in the method, various methods and polishing pads have been proposed.

For example, a polishing pad having, as least a part thereof, a solid and uniform transparent polymer sheet passing a light of wavelengths of 190 nm to 3500 nm therethrough is disclosed (Patent Literature 1). Further, a polishing pad having a stepped transparent plug inserted therein is disclosed (Patent Literatures 2 and 3).

There is also disclosed a polishing pad having an optically transparent member that includes a water-insoluble matrix and water-soluble particles dispersed in the water-insoluble matrix and has a light transmittance of 0.1% or more at 400 to 800 nm (Patent Literatures 4 and 5). Both publications disclose that such a member is used as the end-point detection window.

In conventional windowed polishing pads, however, the window surface tends to be scratched by a dresser or a slurry and gradually reduced in light transmittance as they are used. Therefore, conventional windowed polishing pads have a problem in that when a program based on the initial light transmittance (optical reflectance) is used to detect the end-point, an error may occur in the end-point detection as the light transmittance decreases from the middle stage to the final stage of using the polishing pad.

Patent Literature 1: JP-A 11-512977
Patent Literature 2: JP-A 9-7985
Patent Literature 3: JP-A 10-83977
Patent Literature 4: JP-A 2002-324769
Patent Literature 5: JP-A 2002-324770

DISCLOSURE OF INVENTION

Problems to be Solved by the Invention

The invention has been made to solve the above problem, and an object of the present invention is to provide a polishing pad that is prevented from causing an end-point detection error due to a reduction in light transmittance from the early stage to the final stage of the process, and to provide a method of producing a semiconductor device with a such polishing pad.

Means for Solving the Problems

As a result of investigations in view of the above circumstances, the inventors have found that the above problem can be solved by using the light-transmitting region described below as a light-transmitting region for polishing pads.

Thus, the present invention is directed to a polishing pad, comprising a polishing layer comprising a polishing region and a light-transmitting region, wherein a polishing side surface of the light-transmitting region is subjected to a surface roughness treatment, and the light-transmitting region has a light transmittance of 40% to 60% at a wavelength of 600 nm before use.

The inventors have found that when the polishing side surface of the light-transmitting region is roughened in advance, the light transmittance of the light-transmitting region is less likely to change during use. Even when a program based on the initial light transmittance (optical reflectance) is used to detect the end-point, the polishing pad of the present invention makes it possible to prevent an end-point detection error due to a change in light transmittance from the early stage to the final stage of the process using the polishing pad.

The light-transmitting region is required to have a light transmittance of 40 to 60% at a wavelength of 600 nm before use. If the light transmittance is less than 40% at a wavelength of 600 nm before use, the end-point detection can be disrupted from the early stage of the process using the polishing pad. If the light transmittance is more than 60%, a surface roughening treatment may be insufficient so that it may be impossible to prevent a change in the light transmittance of the light-transmitting region during use.

The polishing side surface of the light-transmitting region preferably has an arithmetic mean surface roughness (Ra) of 1 to 2.2 µm. If the arithmetic mean surface roughness (Ra) is less than 1 µm, a change in light transmittance from the early stage to the final stage of using the polishing pad can be significant so that an end-point detection error can be more likely to occur. If the surface roughness (Ra) is more than 2.2 µm, the end-point detection may tend to be disrupted from the early stage of using the polishing pad by light scattering which reduces the light transmittance of the light-transmitting region.

The present invention relate to a method of producing a semiconductor device, which comprises a step of polishing the surface of a semiconductor wafer with the polishing pad described above.

DESCRIPTION OF SYMBOLS

Figure 1:
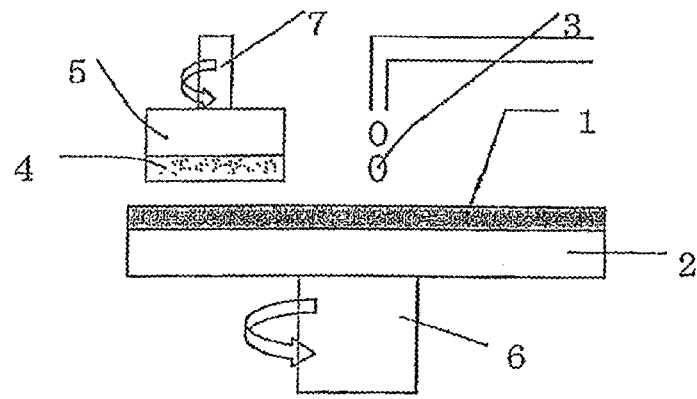
FIG. 1 is a schematic view of a construction showing an example of a conventional polishing apparatus used in CMP polishing.

1: Polishing pad
2: Polishing platen
3: Abrasive liquid (slurry)
4: Polished material (wafer)
5: Supporting stand (polishing head)
6, 7: Rotating shaft
8: Light-transmitting region
9: Polishing region
10, 12: Double sided tape
11: Cushion layer
13: Release paper (film)
14: Member closing an aperture
15: Laser interferometer
16: Laser beam

DETAILED DESCRIPTION OF THE PREFERRED EXAMPLES

The polishing pad of the present invention comprises at least a polishing region and a light-transmitting region, and a polishing side surface of the light-transmitting region is subjected to a surface roughness treatment.

The light-transmitting region is preferably made of a material that allows high-precision optical detection of the end-point during polishing and has a light transmittance of 75% or more, more preferably 80% or more, at a wavelength of 600 nm, while the main component of the light-transmitting region is not particularly limited. If the material itself has low light transmittance, the light transmittance of the light-transmitting region may decrease during use, so that the end-point detection may be hindered. Examples of such a material include: thermoset resins such as a polyurethane resin, a polyester resin, a phenol resin, a urea resin, a melamine resin, an epoxy resin and an acrylic resin; thermoplastic resins such as a polyurethane resin, a polyester resin, a polyamide resin, a cellulose-based resin, an acrylic resin, a polycarbonate, a halogen containing resin (polyvinyl chloride, polytetrafluoroethylene, polyvinylidene fluoride and the like), a polystyrene and an olefinic resin (polyethylene, polypropylene and the like); light curable resins curable with irradiation of light such as ultraviolet and an electron beam; and photosensitive resins. The resins may be used either alone or in combination of two or more kinds. In a case where a light curable resin is employed, a photo-polymerization initiator is preferably employed together. Above all, thermoplastic polyurethane resins are preferably used, because they achieve the desired light transmittance, have good formability and allow easy control of hardness.

Examples of the method for roughening one side of the light-transmitting region include (1) a method of subjecting one side of a resin sheet to sand blasting, surface texturing (embossing), etching, corona discharge treatment, or laser irradiation; (2) a method of performing injection molding or molding with a textured die; (3) a method of forming a pattern on one side of a resin sheet being formed by extrusion; (4) a method of forming a pattern on one side of a resin sheet with a metal roll, a rubber roll or an embossing roll having a given surface pattern; and (5) a method of performing buffing with an abrasive material such as sandpaper.

Example of the shape of the roughened surface include, but are not limited to, a continuous pattern, a discontinuous pattern, a linear pattern, a non-linear pattern, a textured or embossed pattern, and a pearskin finished pattern. In particular, the roughened surface preferably has a textured or embossed pattern.

The roughened surface preferably has an arithmetic mean surface roughness (Ra) of 1 to 2.2 µm, more preferably 1.1 to 1.9 µm. In general, the non-roughened, polishing platen-side surface of the light-transmitting region has an arithmetic mean surface roughness (Ra) of about 0.3 µm.

The light-transmitting region preferably has a light transmittance of 40 to 55% at a wavelength of 600 nm before use.

The shape of the light-transmitting region is not particularly limited, but is preferably similar to the shape and size of the opening of the polishing region.

Though no specific limitation is placed on a thickness of a light-transmitting region, it is preferably that a thickness thereof is equal to or less than that of a polishing region. If a thickness of a light-transmitting region is more than that of a polishing region, an adverse possibility arises that causes a scratch on a wafer by the action of a protruded portion during polishing.

The material for forming the polishing region can be used without particular limitation insofar as it is usually used as the material of a polishing layer, but in the present invention, fine-cell foam is preferably used. The material for forming the polishing region includes, for example, polyurethane resin, polyester resin, polyamide resin, acrylic resin, polycarbonate resin, halogenated resin (polyvinyl chloride, polytetrafluoroethylene, polyvinylidene fluoride etc.), polystyrene, olefinic resin (polyethylene, polypropylene etc.), epoxy resin, and photosensitive resin. These may be used alone or as a mixture of two or more thereof.

The polyurethane resin is a particularly preferable material because it is excellent in abrasion resistance and a polyurethane polymer having desired physical properties can be easily obtained by changing its raw material composition.

The method of finely foaming the polyurethane resin includes, but is not limited to, a method of adding hollow beads and a method of forming foam by mechanical foaming, chemical foaming etc. These methods can be simultaneously used, but the mechanical foaming method using an active hydrogen group-free silicone-based surfactant consisting of a polyalkyl siloxane/polyether copolymer is more preferable. As the silicone-based surfactant, SH-192 and L-5340 (Toray Dow Corning Silicone Co., Ltd.) can be mentioned as a preferable compound.

Description will be given of an example of a method of producing a polyurethane foam of a closed cell type constituting a polishing region below. A method of manufacturing such a polyurethane foam has the following steps:
1) a foaming step of preparing a bubble dispersion liquid of an isocyanate-terminated prepolymer, wherein a silicone-based surfactant is added into an isocyanate-terminated prepolymer, which is agitated in the presence of a non-reactive gas to thereby disperse the non-reactive gas into the prepolymer as fine bubbles and obtain a bubble dispersion liquid. In a case where the prepolymer is solid at an ordinary temperature, the prepolymer is preheated to a proper temperature and used in a molten state.
2) a curing agent (chain extender) mixing step, wherein a chain extender is added into the bubble dispersion liquid, which is agitated to thereby obtain a foaming reaction liquid.
3) a casting step, wherein the forming reaction liquid is cast into a mold.
4) a curing step, wherein the foaming reaction liquid having been cast into the mold is heated and reaction-cured.

The non-reactive gas used for forming fine cells is preferably not combustible, and is specifically nitrogen, oxygen, a carbon dioxide gas, a rare gas such as helium and argon, and a mixed gas thereof, and the air dried to remove water is most preferable in respect of cost.

As a stirrer for dispersing the silicone-based surfactant-containing isocyanate-terminated prepolymer to form fine cells with the non-reactive gas, known stirrers can be used without particular limitation, and examples thereof include a homogenizer, a dissolver, a twin-screw planetary mixer etc. The shape of a stirring blade of the stirrer is not particularly limited either, but a whipper-type stirring blade is preferably used to form fine cells.

In the method of producing the polyurethane foam, heating and post-curing of the foam obtained after casting and reacting the forming reaction liquid in a mold until the dispersion lost fluidity are effective in improving the physical properties of the foam, and are extremely preferable. The forming reaction liquid may be cast in a mold and immediately post-cured in a heating oven, and even under such conditions, heat is not immediately conducted to the reactive components, and thus the diameters of cells are not increased. The curing reaction is conducted preferably at normal pressures to stabilize the shape of cells.

In the production of the polyurethane resin, a known catalyst promoting polyurethane reaction, such as tertiary amine- or organotin-based catalysts, may be used. The type and amount of the catalyst added are determined in consideration of flow time in casting in a predetermined mold after the mixing step.

Production of the polyurethane foam may be in a batch system where each component is weighed out, introduced into a vessel and mixed or in a continuous production system where each component and a non-reactive gas are continuously supplied to, and stirred in, a stirring apparatus and the resulting cell dispersion is transferred to produce molded articles.

The polishing region is produced by cutting the above prepared polyurethane foam into a piece of predetermined size.

The polishing region consisting of fine-cell foam is preferably provided with grooves for retaining and renewing slurry on the surface of the polishing pad which contacts with a polished material. The polishing region composed of fine-cell foam has many openings to retain slurry, and for further efficient retention and renewal of slurry and for preventing the destruction of a polished material by adsorption, the polishing region preferably has grooves on the surface thereof in the polishing side. The shape of the grooves is not particularly limited insofar as slurry can be retained and renewed, and examples include latticed grooves, concentric circle-shaped grooves, through-holes, non-through-holes, polygonal prism, cylinder, spiral grooves, eccentric grooves, radial grooves, and a combination of these grooves. The groove pitch, groove width, groove thickness etc. are not particularly limited either, and are suitably determined to form grooves. These grooves are generally those having regularity, but the groove pitch, groove width, groove depth etc. can also be changed at each certain region to make retention and renewal of slurry desirable.

The method of forming grooves is not particularly limited, and for example, formation of grooves by mechanical cutting with a jig such as a bite of predetermined size, formation by casting and curing resin in a mold having a specific surface shape, formation by pressing resin with a pressing plate having a specific surface shape, formation by photolithography, formation by a printing means, and formation by a laser light using a $CO_2$ gas laser or the like.

Although the thickness of the polishing region is not particularly limited, the thickness is about 0.8 to 4 mm. The method of preparing the polishing region of this thickness includes a method wherein a block of the polyurethane foam is cut in predetermined thickness by a slicer in a band saw system or a planing system, a method that involves casting resin into a mold having a cavity of predetermined thickness and curing the resin, a method of using coating techniques and sheet molding techniques, etc.

No specific limitation is placed on a method for manufacturing a polishing pad having a polishing region and a light-transmitting region, and various methods are practically available as ideas and description will be given of concrete examples below. Note that though polishing pads each with a cushion layer are described in the following examples, the methods may be applied to a polishing pad without a cushion layer.

Figure 2:
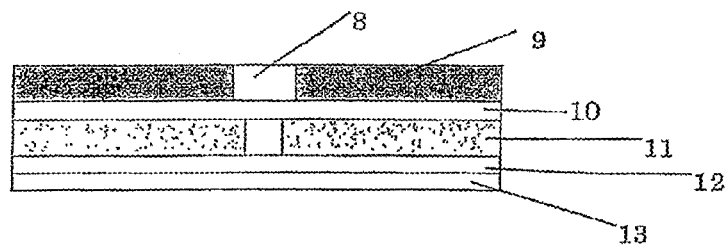
FIG. 2 is a schematic sectional view showing an example of a polishing pad of the present invention.

First of all, in a first example, as shown in FIG. 2, a polishing region 9 with an aperture with a predetermined size is adhered to a double sided tape 10, and a cushion layer 11 with an aperture with a predetermined size is adhered onto the lower surface of the double sided tape 10 so that the aperture of the cushion layer 11 coincides with the aperture of the polishing region 9. Then, a double sided tape 12 attached with a release paper 13 is adhered to the cushion layer 11 and the light-transmitting region 8 is fittingly inserted into the aperture of the polishing region 9 and adhered to the former double sided tape. In this process, it is necessary that the light-transmitting region 8 is inserted so that its roughened surface is placed on the polishing side. The same also applies to the embodiments described below.

Figure 3:
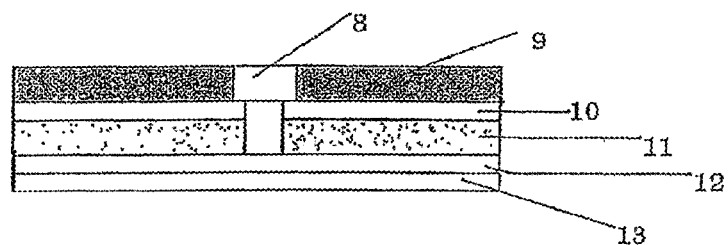
FIG. 3 is a schematic sectional view showing another example of the polishing pad of the present invention.

In a second concrete example, as shown in FIG. 3, a polishing region 9 with an aperture with a predetermined size is adhered onto a double sided tape 10 and a cushion layer 11 is adhered onto the lower surface of the double sided tape 10. Thereafter, the double sided tape 10 and the cushion layer 11 are bored so as to form an aperture with a predetermined size which coincides with the aperture of the polishing region 9. Then a double sided tape 12 attached with a release paper 13 is adhered onto the cushion layer 11 and a light-transmitting region 8 is fittingly inserted into the aperture of the polishing region 9 to thereby adhere the light-transmitting region 8 to the former double sided tape.

Figure 4:
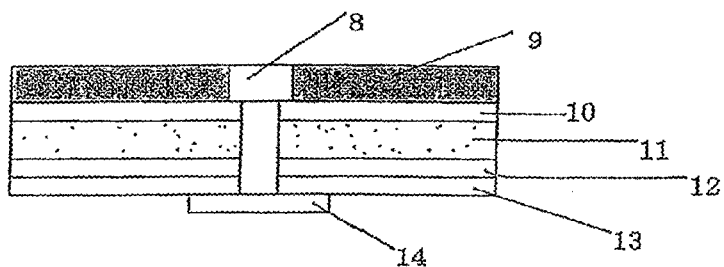
FIG. 4 is a schematic sectional view showing another example of the polishing pad of the present invention.

In a third concrete example, as shown in FIG. 4, a polishing region 9 with an aperture with a predetermined size is adhered onto a double sided tape 10 and a cushion layer 11 is adhered onto the lower surface of the double sided tape 10. Then, a double sided tape 12 attached with a release paper 13 is adhered onto the other surface of the cushion layer 11 from the polishing region 9 and thereafter from the double sided tape 10 to the release paper 13 are bored so as to form an aperture with a predetermined size so as to coincide with the aperture of the polishing region 9. A light-transmitting region 8 is fittingly inserted into the aperture of the polishing region 9 to thereby adhere the light-transmitting region 8 to the former double sided tape. Note that in this case, since the other side of the light-transmitting region 8 from the front side thereof is open in the air and dust or the like is collected therein, a member 14 closing the aperture on the other side is preferably mounted.

Figure 5:
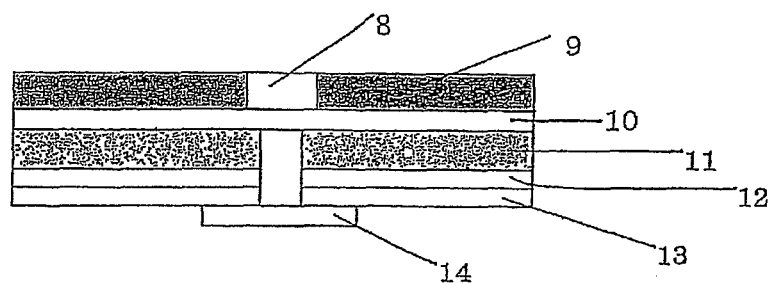
FIG. 5 is a schematic sectional view showing another example of the polishing pad of the present invention.
Figure 6:
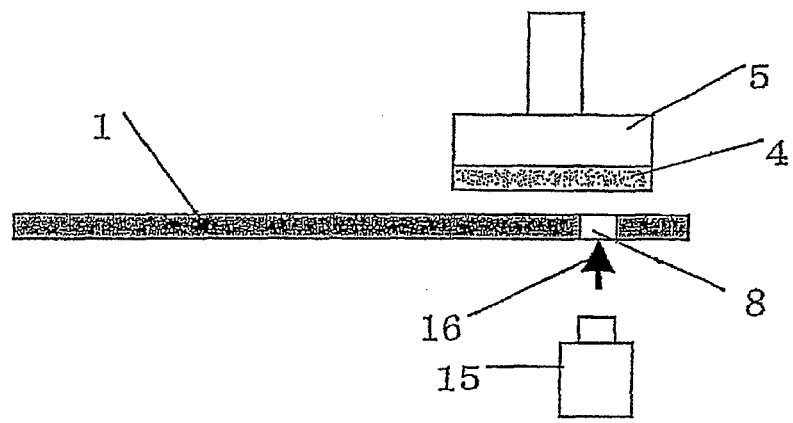
FIG. 6 is a schematic view of a construction showing an example of a CMP polishing apparatus having an end-point detecting device of the present invention.

In a fourth example, as shown in FIG. 5, a cushion layer 11 to which a double sided tape 12 attached with a release paper 13 is adhered is bored so as to form an aperture with a predetermined size. Then, a polishing region 9 bored so as to form an aperture with a predetermined size is adhered onto the double sided tape 10 so that both apertures coincide with each other. Thereafter, a light-transmitting region 8 is fittingly inserted into the aperture of the polishing region 9 to thereby adhere the light-transmitting region 8 to the latter double sided tape. Note that in this case, since the other side of the light-transmitting region 8 from the front side thereof is open in the air and dust or the like is collected therein, a member 14 closing the aperture on the other side is preferably mounted.

In the methods for manufacturing a polishing pad, no specific limitation is placed on a means for boring the polishing region and the cushion layer, and, for example, a method for boring them by pressing a tool having a cutting ability, a method using a laser such as a carbon oxide gas laser and a method in which a work is cut by a tool such as a bite. Note that no specific limitation is placed on a size and shape of the aperture of the polishing region.

The cushion layer compensates for characteristics of the polishing layer (polishing region). The cushion layer is required for satisfying both planarity and uniformity which are in a tradeoff relationship in chemical mechanical polishing (CMP). Planarity refers to flatness of a pattern region upon polishing an object of polishing having fine unevenness generated upon pattern formation, and uniformity refers to the uniformity of the whole of an object of polishing. Planarity is improved by the characteristics of the polishing layer, while uniformity is improved by the characteristics of the cushion layer. The cushion layer used in the polishing pad of the present invention is preferably softer than the polishing layer.

The material forming the cushion layer is not particularly limited, and examples of such material include a nonwoven fabric such as a polyester nonwoven fabric, a nylon nonwoven fabric or an acrylic nonwoven fabric, a nonwoven fabric impregnated with resin such as a polyester nonwoven fabric impregnated with polyurethane, polymer resin foam such as polyurethane foam and polyethylene foam, rubber resin such as butadiene rubber and isoprene rubber, and photosensitive resin.

The means of sticking the polishing layer used in the polishing region 9 on the cushion layer 11 includes, for example, a method of pressing the polishing region and the cushion layer having a double sided tape therebetween.

The double sided tape has a general constitution wherein an adhesive layer is arranged on both sides of a base material such as a nonwoven fabric or a film. In consideration of permeation of slurry into the cushion layer, a film is preferably used as the base material. The composition of the adhesive layer includes, for example, a rubber-based adhesive and an acrylic adhesive. In consideration of the content of metallic ion, the acrylic adhesive is preferable because of a lower content of metallic ion. Because the polishing region and the cushion layer can be different in composition, the composition of each adhesive layer of the double sided tape can be different to make the adhesion of each layer suitable.

The means of sticking the cushion layer 11 on the double sided tape 12 includes a method of sticking the double sided tape by pressing on the cushion layer.

As described above, the double sided tape has a general constitution wherein an adhesive layer is arranged on both sides of a base material such as a nonwoven fabric or a film. In consideration of removal of the polishing pad after use from a platen, a film is preferably used as the base material in order to solve a residual tape. The composition of the adhesive layer is the same as described above.

The member 14 is not particularly limited insofar as the opening is closed therewith. When polishing is conducted, it should be releasable.

The semiconductor device is produced by a step of polishing the surface of a semiconductor wafer by using the polishing pad. The semiconductor wafer generally comprises a wiring metal and an oxide film laminated on a silicon wafer. The method of polishing a semiconductor wafer and a polishing apparatus are not particularly limited, and as shown in FIG. 1, polishing is conducted for example by using a polishing apparatus including a polishing platen 2 for supporting a polishing pad 1, a supporting stand (polishing head) 5 for supporting a semiconductor wafer 4, a backing material for uniformly pressurizing the wafer, and a mechanism of feeding an abrasive 3. The polishing pad 1 is fitted, for example via a double sided tape, with the polishing platen 2. The polishing platen 2 and the supporting stand 5 are provided with rotating shafts 6 and 7 and arranged such that the polishing pad 1 and the semiconductor wafer 4, both of which are supported by them, are arranged to be opposite to each other. The supporting stand 5 is provided with a pressurizing mechanism for pushing the semiconductor wafer 4 against the polishing pad 1. For polishing, the polishing platen 2 and the supporting stand 5 are rotated and simultaneously the semiconductor wafer 4 is polished by pushing it against the polishing pad 1 with slurry fed thereto. The flow rate of slurry, polishing loading, number of revolutions of the polishing platen, and number of revolutions of the wafer are not particularly limited and can be suitably regulated.

Protrusions on the surface of the semiconductor wafer 4 are thereby removed and polished flatly. Thereafter, a semiconductor device is produced therefrom through dicing, bonding, packaging etc. The semiconductor device is used in an arithmetic processor, a memory etc.

EXAMPLES

Hereinafter, the Examples illustrating the constitution and effect of the first to third inventions are described. Evaluation items in the Examples etc. were measured in the following manner.

Measurement of Arithmetic Mean Surface Roughness (Ra)

The arithmetic mean surface roughness (Ra) of the roughened surface and the non-treated surface of the light-transmitting region were measured according to JIS B 0601-1994.

Measurement of Light Transmittance of Light-Transmitting Region Before and after Surface Roughening Treatment The light-transmitting region before the surface roughening treatment was cut into a sample piece 10 mm×50 mm in size (1.25 mm in thickness) for light transmittance measurement. The sample was placed in a glass cell (10 mm (optical path length)×10 mm (optical path width)×45 mm (height), manufactured by Sogo Laboratory Glass Works Co., Ltd.) filled with ultrapure water, and the light transmittance of the sample was measured at a wavelength of 600 nm using a spectrophotometer (UV-1600PC, manufactured by Shimadzu Corporation). The measured light transmittance was converted into a value per 1 mm thickness according to the Lambert-Beer law. The light transmittance of the light-transmitting region after the surface roughening treatment was also measured by the same method as described above.

Measurement of Rate of Change in Light Transmittance

The rate of change in light transmittance was calculated from the formula below using the light transmittance (A) of the light-transmitting region at a wavelength of 600 nm before use and the light transmittance (B) of the light-transmitting region at a wavelength of 600 nm after polishing of 500 pieces of wafer (1 μm thermal oxide film-coated 8-inch silicon wafer), in which the polishing was performed for 1 minute per piece. The rate of change is preferably 30% or less. Each light transmittance was measured by the same method as described above. The polishing apparatus was SPP600S (manufactured by Okamoto Machine Tool Works, Ltd.). The polishing conditions were as follows: a silica slurry (SS12 manufactured by Cabot Microelectronics Corporation) added at a flow rate of 150 ml/minute during polishing; a polishing load of 350 g/cm$^2$; a polishing platen rotation speed of 35 rpm; and a wafer rotation speed of 30 rpm.

Rate of change (%)=[(A−B)/A]×100

Example 1

Preparation of Light-Transmitting Region

A thermoplastic polyurethane (Miractran E567, manufactured by Nippon Polyurethane Industry Co., Ltd.) was used and subjected to injection molding with a die of which one side was #100 sandblasted, so that a light-transmitting region (length: 56.5 mm, width: 19.5 mm, thickness: 1.25 mm) was formed.

Preparation of Polishing Region

Mixed into a reaction vessel were 100 parts by wt of polyether-based prepolymer (Adiprene L-325, manufactured by Uniroyal Chemical Corporation, with an NCO concentration of 2.22 meq/g) and 3 parts by wt of a silicone-based surfactant (SH192, manufactured by Dow Corning Toray Silicone Co., Ltd.) and a temperature of the mixture was controlled at 80° C. The mixture was vigorously agitated at a rotation number of 900 rpm for about 4 minutes with agitation blades so that bubbles were incorporated into the reaction system. Added into the reaction system was 26 parts by wt of 4,4'-methylenebis(o-chloroaniline) (Iharacuamine MT, manufactured by Ihara Chemical Industry Co., Ltd.) melted at 120° C. in advance. Thereafter, the reaction system was continuously agitated for about 1 minute and the reaction solution was cast into a pan type open mold. When the reaction solution lost fluidity, it was put into an oven and postcured at 110° C. for 6 hours to obtain a polyurethane foam block. The polyurethane foam block was sliced with a band saw type slicer (manufactured by Fecken-Kirfel GmbH & Co.) to obtain a polyurethane foam sheet. Then, the sheet was surface buffed to a predetermined thickness with a buffing machine (manufactured by AMITEC Corporation) to thereby obtain a sheet with an adjusted thickness precision (a sheet thickness of 1.27 mm). The buff-treated sheet was punched to form a disc with a predetermined diameter (61 cm) and recessing was applied on a surface of the disc using a recessing machine (manufactured by TohoKoki Co., Ltd.) to form concentric circular grooves each with a width of 0.25 mm and a depth of 0.40 mm at a groove pitch of 1.50 mm. A double sided tape (a double tack tape, manufactured by Sekisui Chemical Co., Ltd.) was adhered onto a surface on the other side of the sheet from the recessing surface with a laminator and thereafter, an aperture A (a size of 57 mm×20 mm) for fittingly inserting a light-transmitting region was punched at a predetermined position in the recessed sheet to thereby fabricate a polishing region attached with a double sided tape.

Manufacture of Polishing Pad

A cushion layer made of a corona-treated polyethylene foam (TORAYPEF with a thickness of 0.8 mm, manufactured by TORAY INDUSTRIES, INC.) and a surface of which was buffed was adhered onto a pressure sensitive adhesive surface of a polishing region attached with a double sided tape fabricated with a laminator. Then, a double sided tape was adhered to a surface of the cushion layer. The cushion layer was punched so as to form a hole with a size of 51 mm×14 mm within a hole punched in order to fittingly insert a light-transmitting region to thereby form an aperture B. The resulting light-transmitting region was inserted into the aperture A in such a manner that the roughened surface was placed on the upper side (the polishing surface side) so that a polishing pad was obtained.

Example 2

A light-transmitting region was prepared using the method of Example 1, except that a die of which one side was #220 sandblasted was used in place of the die of which one side was #100 sandblasted. A polishing pad was prepared using the process of Example 1, except that the resulting light-transmitting region was used instead.

Example 3

A thermoplastic polyurethane (Miractran E567, manufactured by Nippon Polyurethane Industry Co., Ltd.) was used and subjected to injection molding with a die, so that a light-transmitting region (length: 56.5 mm, width: 19.5 mm, thickness: 1.25 mm) was formed. One side of the light-transmitting region was then buffed using a belt sander to which a sheet of #400 sandpaper was attached. A polishing pad was prepared using the method of Example 1, except that the resulting light-transmitting region was used instead.

Comparative Example 1

A thermoplastic polyurethane (Miractran E567, manufactured by Nippon Polyurethane Industry Co., Ltd.) was used and subjected to injection molding with a die, so that a light-transmitting region (length: 56.5 mm, width: 19.5 mm, thickness: 1.25 mm) was formed. A polishing pad was prepared using the method of Example 1, except that the resulting light-transmitting region was used instead.

Comparative Example 2

A polyether prepolymer (Adiprene L-325, manufactured by Uniroyal Chemical Company Ltd.) and 4,4'-methylenebis(o-chloroaniline) (Iharacuamine MT, manufactured by Ihara Chemical Industry Co., Ltd.) were mixed at an NCO index of 1.10 and stirred for about 1 minute. The reaction solution was then poured into a loaf-shaped open mold. When the reaction solution lost its fluidity, it was placed in an oven and subjected to post curing at 110° C. for 6 hours so that a polyurethane resin block was obtained. The polyurethane resin block was sliced using a band saw type slicer (manufactured by Fecken-Kirfel GmbH & Co.) so that a polyurethane resin sheet (1.25 mm in thickness) was obtained. The sheet was formed by stamping into a 56.5 mm length, 19.5 mm width piece, which was used as a light-transmitting region. A polishing pad was prepared using the method of Example 1, except that the resulting light-transmitting region was used instead.

Comparative Example 3

A thermoplastic polyurethane (Miractran E567, manufactured by Nippon Polyurethane Industry Co., Ltd.) was used and subjected to injection molding with a die of which one side was textured (Type AHO-1012 texturing by Ayamadai Corporation), so that a light-transmitting region (length: 56.5 mm, width: 19.5 mm, thickness: 1.25 mm) was formed. A polishing pad was prepared using the method of Example 1, except that the resulting light-transmitting region was used instead.

Comparative Example 4

A thermoplastic polyurethane (Miractran E567, manufactured by Nippon Polyurethane Industry Co., Ltd.) was used and subjected to injection molding with a die of which both sides were #220 sandblasted, so that a light-transmitting region (length: 56.5 mm, width: 19.5 mm, thickness: 1.25 mm) was formed. A polishing pad was prepared using the method of Example 1, except that the resulting light-transmitting region was used instead.

TABLE 1

| | Ra (μm) | Light transmittance (%) before surface roughening treatment | Light transmittance (%) after surface roughening treatment | Rate (%) of change in light transmittance |
|---|---|---|---|---|
| Example 1 | 1.5 | 91 | 43 | 9.3 |
| Example 2 | 1.1 | 91 | 52 | 25.1 |
| Example 3 | 1.8 | 91 | 45 | 13.3 |
| Comparative Example 1 | 0.16 | 91 | — | 57.1 |
| Comparative Example 2 | 0.21 | 75 | — | 48.0 |
| Comparative Example 3 | 0.59 | 91 | 64 | 54.7 |
| Comparative Example 4 | 1.1 | 91 | 37 | 36.3 |

The invention claimed is:

1. A polishing pad, comprising a polishing layer comprising a polishing region having an aperture and a light-transmitting region inserted into the aperture in the polishing region, wherein a polishing side surface of the light-transmitting region is, prior to polishing, subjected to a surface roughness treatment so as to have a surface roughness, and the light-transmitting region has a light transmittance of 40% to 60% at a wavelength of 600 nm before use, wherein the surface roughness of the polishing side surface of the light-transmitting region is an arithmetic mean surface roughness (Ra) of 1 μm to 2.2 μm, and the light-transmitting region is made only of a thermoset resin material having a light transmittance of 75% or more at the wavelength of 600 nm.

2. The polishing pad according to claim 1, wherein the polishing side surface of the light-transmitting region is flush with a polishing side surface of the polishing region.

3. A method for manufacturing a semiconductor device comprising steps of polishing a surface of a semiconductor wafer using a polishing pad according to claim 1.

* * * * *